(12) United States Patent
Ke et al.

(10) Patent No.: US 7,875,959 B2
(45) Date of Patent: Jan. 25, 2011

(54) SEMICONDUCTOR STRUCTURE HAVING SELECTIVE SILICIDE-INDUCED STRESS AND A METHOD OF PRODUCING SAME

(75) Inventors: Chung-Hu Ke, Taipei (TW); Wen-Chin Lee, Hsin-Chu (TW); Chenming Hu, Alamo, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 130 days.

(21) Appl. No.: 11/216,512

(22) Filed: Aug. 31, 2005

(65) Prior Publication Data

US 2007/0045849 A1 Mar. 1, 2007

(51) Int. Cl.
*H01L 29/04* (2006.01)
(52) U.S. Cl. ..................... 257/627; 257/628
(58) Field of Classification Search ........... 257/627, 257/628
See application file for complete search history.

(56) References Cited

U.S. PATENT DOCUMENTS

| | | | |
|---|---|---|---|
| 5,182,232 A * | 1/1993 | Chhabra et al. ............. 438/398 |
| 5,587,590 A * | 12/1996 | Matsubara ................. 257/48 |
| 5,869,362 A | 2/1999 | Ohtani |
| 6,023,082 A | 2/2000 | McKee et al. |
| 6,191,855 B1 | 2/2001 | Maris |
| 6,524,927 B1 | 2/2003 | Sugawara et al. |
| 6,627,527 B1 | 9/2003 | Wang et al. |
| 6,793,468 B2 * | 9/2004 | Ojima et al. ............ 417/407 |
| 6,958,263 B2 * | 10/2005 | Bhattacharyya ........... 438/133 |
| 7,012,024 B2 | 3/2006 | Abbott |
| 2002/0153527 A1 * | 10/2002 | Chang et al. ............ 257/70 |
| 2004/0150111 A1 * | 8/2004 | Shimazu et al. ........... 257/757 |
| 2005/0001290 A1 * | 1/2005 | Chan et al. ............ 257/627 |
| 2005/0001590 A1 * | 1/2005 | Bayne et al. ............ 320/128 |

FOREIGN PATENT DOCUMENTS

| | | |
|---|---|---|
| TW | 552640 | 9/2003 |
| TW | I245418 | 12/2005 |

OTHER PUBLICATIONS

Detavernier, C., et al., "CoSi$_2$ formation using a Ti capping layer—The influence of processing conditions on CoSi$_2$ nucleation." Mat. Res. Soc. Symp. Proc.. vol. 670. pp. K7.4.1-K7.4.6.

(Continued)

*Primary Examiner*—Kimberly D Nguyen
*Assistant Examiner*—Mohammad T Karimy
(74) *Attorney, Agent, or Firm*—Slater & Matsil, L.L.P.

(57) ABSTRACT

The channel of a MOSFET is selectively stressed by selectively stressing the silicide layers on the gate electrode and the source/drain. Stress in the silicide layer is selectively produced by orienting the larger dimensions of the silicide grains in a first direction and the smaller dimensions in a second, perpendicular direction, with one of the directions being parallel to the direction of carrier movement in the channel and the other direction being perpendicular thereto.

19 Claims, 5 Drawing Sheets

OTHER PUBLICATIONS

Detavernier, C., et al., "The influence of Ti and TiN on the thermal stability of $CoSi_2$," Mat. Res. Soc. Symp. Proc., vol. 670, pp. K6.7.1-K6.7.6.

Chen, Y., et al. "Manufacturing Enhancements for $CoSi_2$ Self-Aligned Silicide at the 0.12-μm CMOS Technology Node," IEEE Transactions on Electron Devices, vol. 50, No. 10, Oct. 2003, pp. 2120-2125.

Steegen, A., et al., "Silicide-induced stress in Si: origin and consequences for MOS technologies," Reports: A Review Journal, Materials Science and Engineering, R 38, 2002, pp. 1-53.

Maiti, C.K., "Applications of Silicon-Germanium Heterostructure," Institute of Physics Publishing, 2000, Ch. 2, pp. 32-42.

Gambino, J.P., et al., "Silicides and Ohmic Contacts," Materials Chemistry and Physics 52, 1998, pp. 99-146.

Kumagai, Y., et al., "Evaluation of change in drain current due to strain in 0.13μm-node MOSFETs," Extended Abstracts of the 2002 International Conference on Solid State Devices and Materials, Nagoya, 2002, pp. 14-15.

Xiao, H., "Introduction to Semiconductor Manufacturing Technology," Dec. 4, 2000, pp. 95 and 456-457, Prentice Hall, Upper Saddle River, New Jersey.

Chao, C-P., "Metal-induced crystallization of amorphous silicon by wafer bonding," 2002, pp. I-LVII.

* cited by examiner

SEMICONDUCTOR STRUCTURE HAVING SELECTIVE SILICIDE-INDUCED STRESS AND A METHOD OF PRODUCING SAME

TECHNICAL FIELD

The present invention relates to a semiconductor structure that is selectively stressed by silicide-induced forces and by an appropriately selected cap layer, and also relates to a method of producing such a structure. More specifically, the present invention contemplates a semiconductor structure, such as a FET or other transistor, having one or more silicide film contacts and having a stress enhancing cap layer formed thereover, the characteristics and quality of the silicide film being selected to enhance the electrical operation of the semiconductor device. The present invention also relates to methods of producing and forming silicide films having the selected characteristics and quality.

BACKGROUND

It is known that carrier (electron or hole) mobility and flow, as well as drive current and other electrical properties, of semiconductor devices, such as FETs or other transistors, are influenced by mechanical compressive and tensile stresses. For example, electron mobility in one or more directions within bulk or SOI silicon that is under uniaxial or biaxial tensile stress is enhanced, while hole mobility is degraded. Similarly, if the silicon is under uniaxial or biaxial compressive stress, hole mobility in one or more directions is enhanced, but electron mobility is degraded.

Uniaxial and biaxial compressive and tensile stresses in the channel of a FET are known to be produced by shallow trench isolation, silicon nitride etch-stops, silicide contacts, epitaxial layers on the substrate and on the etch-stop layer, and other artifacts of fabrication. While these stresses have been analyzed and their causes investigated, precise control thereof to achieve selective and controlled enhancement or degradation of carrier mobility has been somewhat elusive. Some techniques for producing beneficial stress have been developed, but various factors, such as cost, scalability and fabrication integration have so far led to limited adoption of these techniques.

SUMMARY OF THE INVENTION

In a first aspect, the present invention contemplates a MOSFET having a channel formed in a silicon substrate. The channel is selectively stressed by a metal silicide layer formed over a polysilicon gate electrode and the source and the drain. The silicide layer produces stress in the polysilicon, which, in turn, produces stress in the underlying, defined-in-silicon channel. The silicide layer also produces stress in the portions of the substrate containing the source and the drain.

The silicide layer is formed so that the major dimensions or axes of its grains are aligned in the same first direction, the minor dimensions or axes of the grains are aligned in the same second direction, and the first and second directions are perpendicular to each other. Moreover, one of the directions is parallel to the direction of carrier movement in the channel, while the other direction is perpendicular to the direction of carrier movement.

In one specific embodiment, the MOSFET is an NMOS device, wherein the first direction is perpendicular to the direction of carrier movement and the second direction is parallel to the direction of carrier movement. In another specific embodiment, the MOSFET is a PMOS device, wherein the first direction is parallel to the direction of carrier movement and the second direction is perpendicular to carrier movement. The preferred direction of carrier movement in both devices is along the <110> direction of the silicon substrate, although the <100> and <111> directions are contemplated.

According to a second aspect of the present invention, there is contemplated a method of producing the previously described MOSFET. A metal-containing reactive layer is formed on the polysilicon gate electrode and on the portions of the silicon substrate in which the source and the drain are located. A metal-containing cap layer is formed over the reactive layer. The coefficient of thermal expansion of the cap layer is different from that of the substrate. The assembly is then heated to react some of the reactive layer with the polysilicon gate electrode and the silicon containing the source and drain. This reaction produces a metal silicide layer atop the gate electrode and on the source/drain-containing portions of the silicon substrate. The cap layer results in the above-described orientation of the major and minor axes of the grains of the metal silicide.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the preferred embodiments of the present invention, the grain orientation and grain size of the silicide layers is controlled in order to enhance the electrical operation of the device of which the silicide layer forms a part. The precise mechanism by which grain size and orientation is achieved is not fully known. It is speculated that the underlying active region, being asymmetric, is under strains in different directions arising from several process steps and features. Among these could be the formation of shallow trench isolation regions, thermal steps such as gate oxide growth, and the like. The active region thus may have less compressive strain in the direction parallel to the channel region than in the perpendicular direction. By using a cap layer that introduces a large tensile stress, this may induce the desirable grain size and grain orientations.

As an example, assume a substrate having a (100) surface orientation and a <110> channel orientation. It is desirable to have more tensile (or less compressive) strain in the direction parallel to the channel for an NMOS device, but more compressive (or less tensile) strain for a PMOS device. Higher tensile stress can be introduced by controlling the cap layer thickness or stress level to improve NMOS device performance or less tensile stress to improve PMOS device performance, but not necessarily both. For the same exemplary transistor, greater tensile (or less compressive) strain in the direction perpendicular to the channel improves device performance for both NMOS and PMOS devices. Likewise, higher tensile stress in this direction can be introduced by controlling the cap layer thickness or stress level, thus improving device performance for both NMOS and PMOS devices. For a transistor in a (100) surface orientation substrate and with a <100> channel orientation, tensile strain can improve NMOS device performance, but it is believed that strain does not impact PMOS device performance significantly.

Figure 1:
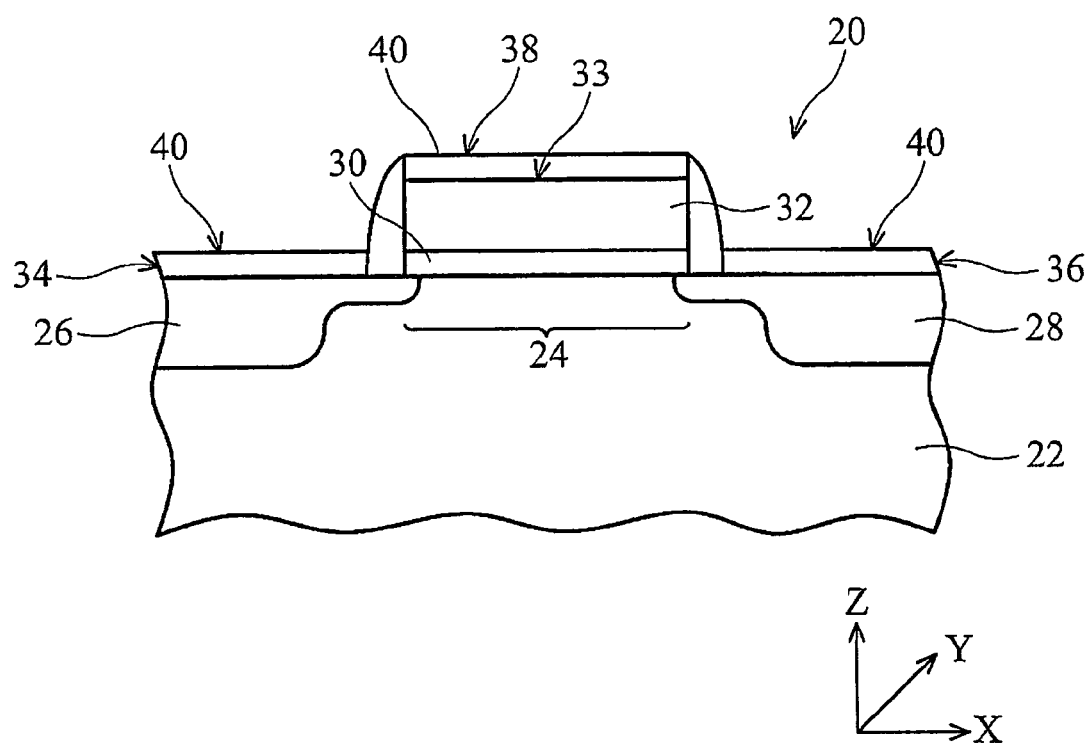
FIG. 1 is a front elevation in an X-Y-Z coordinate system of a completed FET in which embodiments of the present invention with silicide layers having their grains selectively oriented and residing on top of a polysilicon gate electrode and portions of a silicon substrate in which a source and a drain have been formed, may be employed.

Referring first to FIG. 1, the product aspects of preferred embodiments of the present invention are described. FIG. 1 is a simplified front elevation of a FET 20 located in an X-Y-Z coordinate system. Carrier movement in the channel 24 is in the X-direction, perpendicular to the Y-direction. The height of the device 20 is in the Z-direction.

The FET 20 includes a semiconductor body 22, which may be bulk semiconductor or a film or layer of a semiconductor on an insulative substrate ("SOI"). The semiconductor 22 is typically silicon, which is N-doped in a PFET and P-doped in an NFET. A channel 24 in which carriers (electrons or holes) selectively flow is defined within the semiconductor 22 between a source 26 and a drain 28 formed in the semiconductor 22 by implantation, epitaxial growth, or other conventional techniques. Typically, in a PFET the source 26 and drain 28 are P+ regions implanted in the substrate 22, and in an N-FET they are N+ implants. Overlying the channel 24 are a gate dielectric 30 and a conductive gate electrode 32 thereon, together constituting a gate 33. The gate electrode is preferably polysilicon, but may be fully or partially a metal, silicide, or other conductive material.

Normally, carriers (electrons in a FET fabricated by NMOS procedures or holes in a FET fabricated by PMOS procedures), cannot flow in the channel 24 between the source 26 and the drain 28. Application of appropriate electrical signals (negative for a PFET; positive for an NFET) to the gate electrode 32 selectively permits such carrier (and current) flow in the channel 24.

Current flowing in the channel 24 flows between the source 26 and the drain 28 via electrical contacts 34 and 36 superjacent thereto. Preferably, the contacts 34 and 36 are a metal silicide film 40. Electrical signals are applied to the gate electrode 32 via an electrical contact 38 formed thereon, which is also preferably a metal silicide film 40. The silicide films 40 are formed by reacting a film 50 (FIG. 4) of metal with the polysilicon 32 and the substrate 22 in which the source/drain 26/28 are formed. Suitable metals include cobalt (Co), erbium (Er), nickel (Ni), platinum (Pt), tantalum (Ta), titanium (Ti) and tungsten (W).

The conventional formation of polysilicon 32 "locks" it to the underlying substrate 22 via the gate dielectric 30 on which it is formed. The silicide film 40 on the gate electrode 32 is thus locked to the substrate 22. Further, the silicide films 40 on the source 26 and drain 28 are locked to the substrate 22. Thus, any compressive or tensive stress in the films 40 is ultimately applied or transferred to the underlying substrate 22.

Films 40 that are in compressive stress in the X-direction (with tensile stress in the Y-direction) place the channel 24 in compressive stress in the X-direction. Compressive stress of the channel 24 in the X-direction is known to improve the mobility of carriers, holes, along the channel 24 in a PMOS device 20. Films 40 that are in tensile stress in the X-direction (with compressive stress in the Y-direction) place the channel 24 in tensile stress in the X-direction. Tensile stress of the channel 24 in the X-direction is known to improve the mobility of carriers, electrons, along the channel 24 in an NMOS device 20.

According to the present invention, the silicide films 40 are selectively stressed tensively or compressively to apply tensile or compressive stress to the channel 24, that is, along the X- and Y-directions. In preferred embodiments, the X-direction represents the <110> direction of the silicon substrate 22, as well as the <100> and <111> directions thereof. Tensile stress (in an NFET) or compressive stress (in a PFET) is selectively produced in the X-direction of the silicide films 40 and, accordingly, is applied to the channel 24 in the X-direction.

Figure 2:
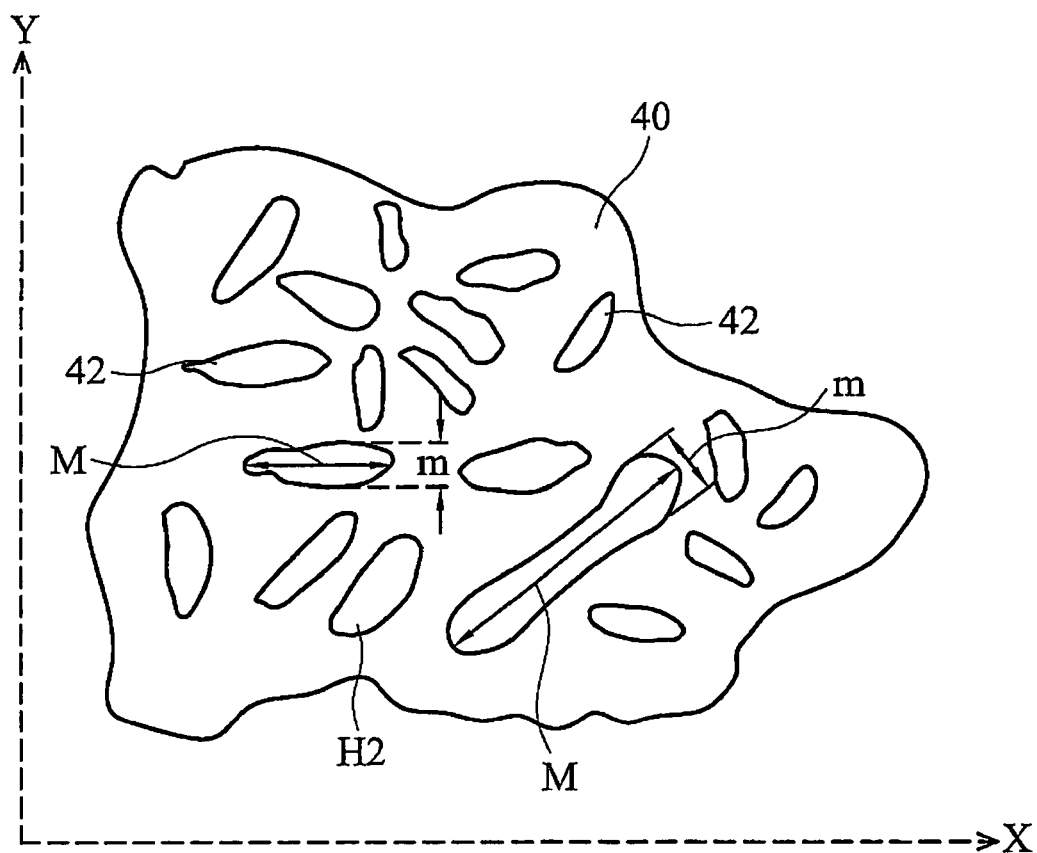
FIG. 2 is a generalized representation in the X-Y-Z coordinate system of a portion of a conventionally formed silicide film that is on the gate electrode and the source and drain of a FET; the major and minor dimensions or axes of the grains of the silicide film have orientations which are randomly oriented with respect to each other and with respect to the X- and Y-directions, and carrier movement is in the X-direction.

FIG. 2 is a generalized, highly magnified top or plan view of a portion of a thin silicide film 40 conventionally formed in the prior art as the contact 38 on the gate electrode 32 or as the contacts 34 and 36 of the source 26 and the drain 28, respectively. Following its conventional formation, the silicide film 40 includes crystalline grains 42 of random sizes that are more or less randomly distributed therewithin. In two dimensions, as shown in FIG. 2, the grains 42 may be viewed as being asymmetric and as having a major, larger dimension or axis M and a minor, smaller dimension or axis m. The dimensions or axes M and m are generally randomly oriented relative to each other. The orientations of the dimensions M and m of the grains 42 are also random. One element of the present invention is the discovery that if the major dimensions M of the grains 42 are oriented in the same first direction, X or Y, and the minor dimensions m are oriented in the same second direction, Y or X, the film 40 is compressively stressed in the first direction and tensively stressed in the second direction.

It is known that subjecting the channel 24 to tensile stress in the direction of current or carrier flow therein improves the operation of NMOS or NFET devices, but degrades the operation of PMOS or PFET devices. It is also known that subjecting the channel 24 to tensile stress perpendicular to the direction of current flow therein improves the operation of PMOS or PFET devices.

Referring back to FIG. 1, the direction of current flow in the channel 24 (and the length of the gate 33) is designated X and the direction perpendicular to current flow in the channel 24 (and the width of the gate 33) is designated Y. X and Y are both parallel to the plane of the film 40 (and to the width and length of the gate 33); the direction Z normal to the plane of the film 40 is not involved herein.

Figure 3A:
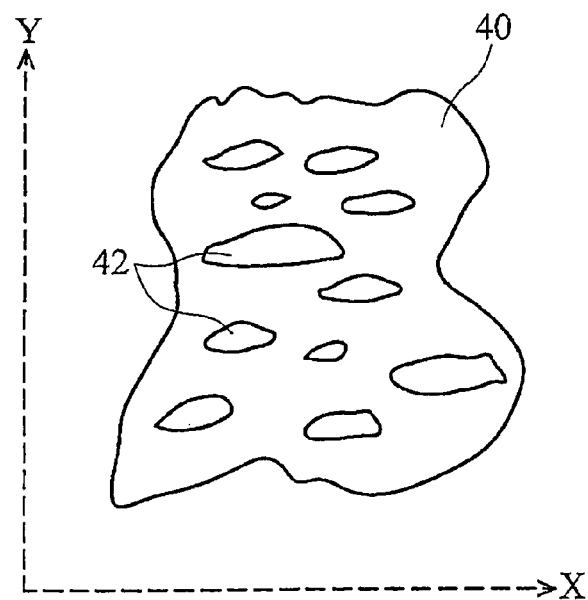
FIG. 3A is a view similar to FIG. 2, but in which the major axes of the silicide grains are selectively rendered mutually parallel and parallel to the X-direction and to the direction of carrier movement, while the minor axes of the grains are mutually parallel and are parallel to the Y-direction and perpendicular to the X-direction, thereby increasing X-direction carrier mobility in an NFET fabricated according to PMOS protocols.

In a typical silicide film 40, the dimensions M and m are randomly oriented with respect to X and Y. By contrast, in FIG. 3A, the major dimensions M of the grains 42 of the film 40 are oriented in the X direction, that is, parallel and in alignment with the direction X of current flow in the channel 24, and the minor dimensions m are aligned with the Y direction. The orientation of the dimensions M and m produces compressive stress in the film 40. This compressive stress is applied to the channel 24 (through the gate dielectric 30) in the X direction, which improves the operation of a PMOS or PFET device.

Figure 3B:
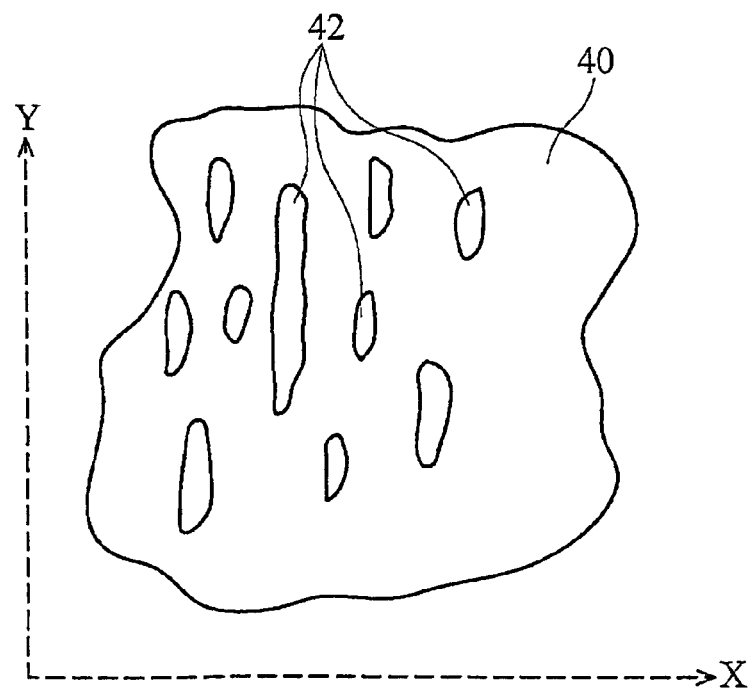
FIG. 3B is similar to FIG. 3A, but the major axes of the silicide grains are selectively rendered mutually parallel and parallel to the Y-direction and perpendicular to the direction of carrier movement; the minor grain axes are mutually parallel and are parallel to the X-direction, thereby increasing X-direction carrier mobility in a PFET fabricated by NMOS protocols.

In FIG. 3B, the major dimensions M of the grains 42 of the film 40 are oriented in the Y dimension, normal to the direction X of current flow in the channel 24. The minor dimensions m are aligned in the X direction. These orientations produce tensive stress in the X direction in the channel 24, which improves the operation of an NMOS or NFET device.

Similarly, tensile stress may be applied to the body 22 above the source 26 and the drain 28 by films 40 formed thereon to form the contacts 34 and 36. Stress applied to the body 22 by the films 40 is also applied to the channel 24. Thus, the films 40 forming the contacts 34, 36 and 38 all contribute to the direction and magnitude of the stress acting on the channel 24.

In its method aspects, the present invention contemplates a method of producing or forming silicide films 40 of the type described above. Specifically, preferred embodiments of the present invention selectively produce tensile stress in the channel 24 in the X direction or the Y direction, depending on whether the FET 20 is an NFET or a pFET.

Figure 4:
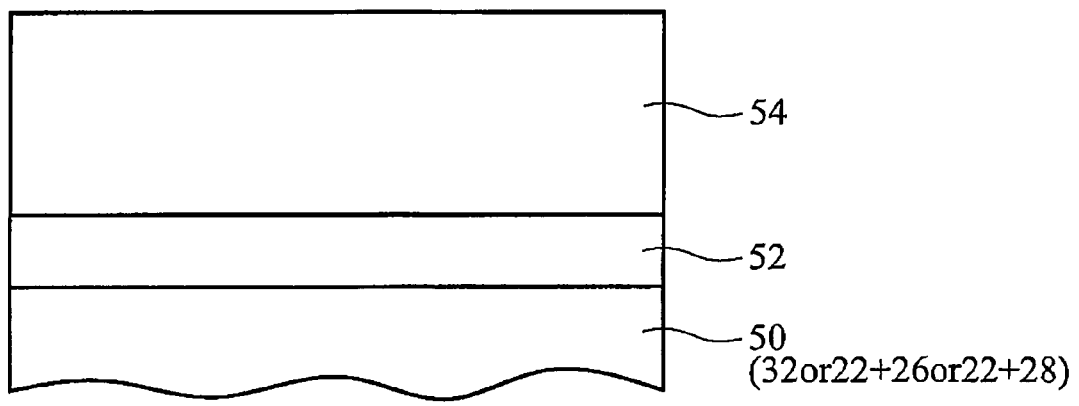
FIG. 4 illustrates a portion of a FET as in FIGS. 1 and 3 during the initial steps of one embodiment of a method of producing the FET, wherein a generalized layer, representing either the polysilicon gate electrode or the source or drain region of the silicon substrate, has formed thereon first, a reactive layer, and second, a cap layer, all of which are subjected to annealing to produce the FET.

Referring now to FIG. 4, there is shown a segment 50 of the device 20 during its fabrication. Specifically, the portion 50 generally represents the silicon-containing polysilicon gate electrode 32 and the regions of the silicon substrate 22 in which the source 26 and the drain 28 have been formed. As a consequence, the reference numeral "50" is followed by the parenthetical legend "32 or 22+26 or 22+28."

A metal reactive layer 52 is formed on the free surface of the segment 50, using a suitable metal, such as cobalt (Co), erbium (Er), nickel (Ni), platinum (Pt), tantalum (Ta), titanium (Ti) or tungsten (W). As is known, when the segment 50 and the reactive layer 52 are brought to a sufficiently high temperature, or annealed, the reactive layer 52 and the silicon of the segment 50 react to form the metal silicide film 40. Some of the upper mass of the segment 50 is consumed as the film 40 forms, while some of the reactive layer 52 may remain unreacted. The metal silicide film 40 so formed is highly electrically conductive and serves as a propitious contact site between the gate electrode 32 and the source/drain 26/28, on the one hand, and a conductor or conductive path, on the other hand.

In the prior art (FIG. 2), the major and minor dimensions or axes M and m of the silicide grains 42 are randomly oriented and distributed, so that the effect, if any, of the film 40 on stress in the channel 24 is unpredictable.

According to preferred embodiments of the present invention, a cap layer 54 is formed on the reactive layer 52 prior to annealing. In order to effectively control the grain size and grain orientation of the subsequently formed silicide layer, attention must be paid to the thermal expansion coefficient (TEC) and the thickness of the cap layer. The cap layer 54 has a TEC that varies from that of the substrate 22 by an amount within a range of about 3:1 to about 6:1. The cap layer 54 is preferably comprised of suitable materials, such as Ti, TiN, and the like. In other embodiments, cap layer 54 may be an insulating material, such as silicon oxide, silicon nitride, or the like. In still other embodiments, the cap layer 54 can be formed of a metal compound. Or, alternatively, the cap layer could be formed of an oxygen containing film, preferably also containing boron, phosphorous, fluorine, or carbon, or a nitrogen containing film, or a silicon containing film. The cap layer is preferably formed by sputtering, although PVD or CVD techniques may be utilized. For instance, assuming a conventionally formed CMOS logic device at a 90 nm technology node, the cap layer 54 preferably has a TEC of about $9.3 \times 10^{-6}$ for an exemplary cap layer of TIN. One possible explanation for the impact of TEC on the grain size is as follows. Volume expansion of layers illustrated in FIG. 4 can be modeled using the equation:

$$\Delta V = \alpha * T * V = \alpha * T * t * A$$

where T is the anneal temperature, A is the silicide area, α is the TEC for the layer, and t is the thickness. The differences in the volume expansions of the layers causes strain on the adjacent layers and, as discussed above, strain in the silicide layer during formation tends to form larger grain sizes in that layer.

For the exemplary 90 nm device, the cap layer 54 would preferably have a thickness of from about 40 Å to about 120 Å, and more preferably about 80 Å. Preferably, the ratio of the cap layer 54 thickness to the reactive layer thickness 52 in the Z-direction is more than about 2:1. This is because it is believed that a thicker cap layer will cause larger grain sizes in the resulting silicide layer, and hence greater tensile strain in the underlying channel region, which is beneficial for an NMOS device. On the other hand, tensile strain degrades the performance of a PMOS device, and hence the ratio is preferably less than about 4:1. If both an NFET and a PFET device 20 are present on the same substrate 22, the appropriate thickness of cap layer 54 is selectively formed on the respective device 20. While a single cap layer thickness has been described, it is well within the scope of the present invention to have a single cap layer with a first thickness of NMOS devices and a second (preferably thinner) thickness of PMOS devices.

In some embodiments, after the layers 52 and 54 have been formed, they are subjected to annealing. Annealing may be carried out at temperatures ranging from about 300 C to about 600 C, and preferably at about 500 C, for times ranging from about 10 seconds to about 6 seconds, and preferably about 30 seconds. Preferably, the reactive layer 52 and the cap layer 54 are formed sequentially in appropriate environments without removal of the device in process after formation of the reactive layer 52.

In other embodiments, the silicide layer 40 may be formed by conventional methods by annealing the reactive layer 52 without the cap layer 54 thereon, following which the cap layer 54 is formed on the silicide layer. Thereafter, the cap layer 54 and the silicide layer 40 are annealed to a temperature above the re-crystallization temperature of the silicide 40. In preferred embodiments, the silicide layer is formed to a thickness of less than about 250 Angstroms. The silicide preferably includes a metal such as cobalt, nickel, titanium, platinum, erbium, tantalum, tungsten or the like, as well as silicon, and may also contain oxygen and or nitrogen.

After the selectively stressed silicide layer 40 is formed, some or all of the cap layer 54 and unreacted portions of the reactive layer 52 may be removed by conventional methods, such as CMP or by exposure to etchants such as $H_2SO_4$, $H_3PO_4$, HCL, or HF. If the cap layer is a conductive material, preferably the entire cap layer is removed prior to subsequent processing. If the cap layer is an insulative material, the cap layer need be only selectively removed and the remaining portions of the cap layer can aid in electrically isolating underlying components from subsequently formed components, such as metal layers.

Figure 6:
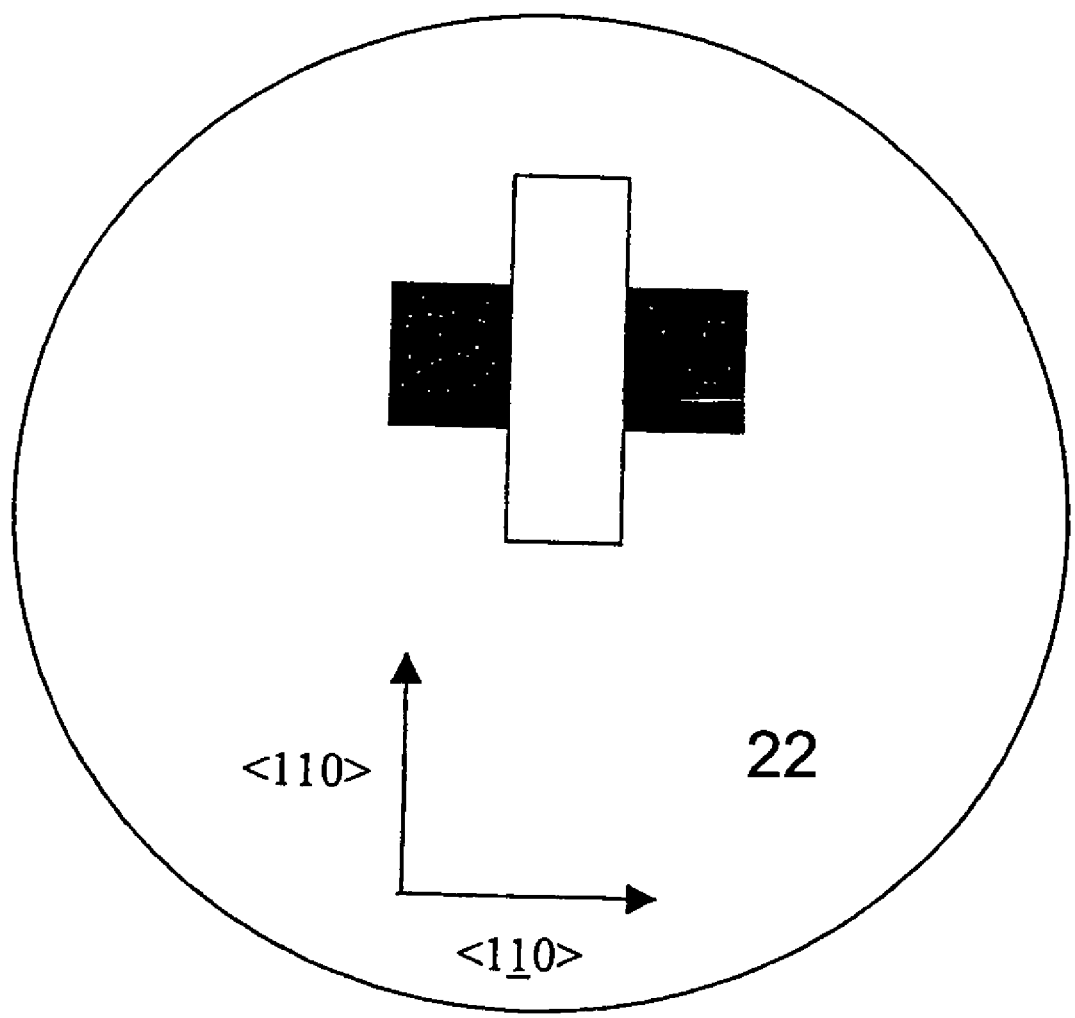
FIG. 6 schematically illustrates in top view a preferred embodiment orientation in which the device channel is oriented to have current flow in the <110> direction.

As noted earlier, the channel 24 is preferably along the <110> direction of the substrate 22 as shown in FIG. 6, although the <100> and <111> directions are also contemplated. It has been found that by orienting the larger and smaller dimensions of the silicide grains 42 at right angles to each other so that one of these dimensions is parallel to the channel in the X-direction and the other dimension is perpendicular to the channel in the Y-direction, current in the channel 24 can be modeled as a linear function of the stress effected by the oriented grain dimensions. While the mechanism is not fully understood, the inventors believe that orienting the channel direction so that current flows in the <110> direction provides optimum results for engineering stress in the underlying device through the use of the silicide film and cap layer. In some embodiments, the cap layer and reactor layer could be deposited as a multi-layer, meaning that the two layers could be deposited in a single step, in multiple in-situ steps, in multiple steps but in the same deposition tool without a vacuum break, and the like. Preferably, cycle time should controlled such that less than four hours elapses from the time of the reactor layer deposition until the time of the cap layer deposition.

Figure 5:
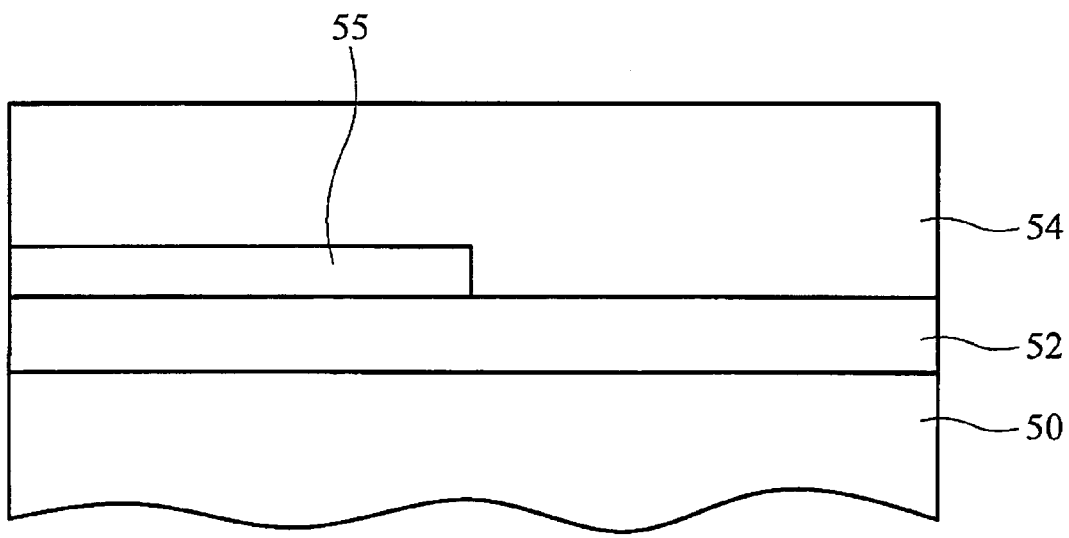
FIG. 5 is similar to FIG. 4, but includes a barrier layer interposed between the reactive layer and the cap layer.

In alternative embodiments, a barrier layer 55 may reside between the reactive layer 52 and the cap layer 54 as shown in FIG. 5. The barrier layer 55 is preferably $SiO_2$ although it may comprise some other suitable material. The barrier layer 55 may be selectively removed (using, e.g., conventional photolithography and etching processes) from above NMOS devices. In this way, the cap layer 54 will induce strain to the underlying silicon above NMOS devices (where the barrier layer has been removed), but the barrier layer will prevent the cap layer from imparting strain on the underlying silicide in those regions where it remains (i.e., above the PMOS devices). This selective removal is illustrated in FIG. 5.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A structure that includes a semiconductor substrate, a dielectric layer on a free surface of the substrate, and an electrode layer on a free surface of the dielectric layer, which structure comprises:
   a silicide layer on a free surface of the electrode layer, grains of the silicide layer having major and minor dimensions, the major dimensions of the grains being generally oriented in a first direction parallel to the free surface of the substrate, and the minor dimensions of the grains being generally oriented in a second direction parallel to the free surface of the substrate, the first and second directions being substantially orthogonal, the major dimensions being larger than the minor dimensions, the silicide layer having a plurality of grains along the first direction and the second direction.

2. The structure of claim 1, wherein the silicide layer includes a metal selected from the group consisting essentially of Co, Er, Ni, Pt, Ta, Ti or W, and combinations thereof.

3. A structure that includes a semiconductor substrate, which structure comprises:
   a silicide layer on a free surface of the substrate, grains of the silicide layer having major and minor dimensions, the major dimensions of the grains being generally oriented in a first direction parallel to the free surface of the substrate, and the minor dimensions of the grains being generally oriented in a second direction parallel to the free surface of the substrate, the first and second directions being substantially orthogonal, the major dimensions being larger than the minor dimensions, the silicide layer having a plurality of grains along the first direction and the second direction.

4. The structure of claim 3, wherein:
   the orthogonal orientation of the grains produces different stress in the substrate in the first and second directions.

5. The structure of claim 4 further comprising:
   a source and a drain formed in the substrate to define therebetween a channel in which carriers can flow in one of the directions.

6. The structure of claim 5, wherein:
   the substrate has a (110) crystalline structure; and
   carrier flow is in the <110>direction.

7. A FET structure that includes a semiconductor substrate, a source and a drain formed in the substrate and defining a channel therebetween, a dielectric layer on a free surface of the substrate and overlying the channel, and an electrode layer on a free surface of the dielectric layer, which structure comprises:
   a silicide layer on a free surface of the electrode layer and on a free surface of the source and the drain, respectively, grains of the silicide layer having major and minor dimensions, the major dimensions of the grains being generally oriented in a first direction parallel to the free surface of the substrate, and the minor dimensions of the grains being generally oriented in a second direction parallel to the free surface of the substrate, the first and second directions being substantially orthogonal, the major dimensions being larger than the minor dimensions, the silicide layer having a plurality of grains along the first direction and the second direction.

8. A structure comprising:
a substrate having a surface, the surface having an X-axis and a Y-axis;
a first impurity region formed substantially within said substrate;
a dielectric partly overlying said first impurity region;
a conductive element overlying said dielectric;
a silicide layer overlying said conductive element, said silicide layer having grains having major and minor dimensions, the major dimensions of the grains being substantially oriented in a first direction, the minor dimensions of the grains being substantially oriented in a second direction, orthogonal to the first direction, the first direction being parallel to a first one of the X-axis and the Y-axis, and the second direction being parallel to a second one of the X-axis and the Y-axis, the major dimensions being larger than the minor dimensions, the silicide layer having a plurality of grains along the first direction and the second direction; and
a spacer adjacent a sidewall of said conductive element.

9. The structure of claim 8 wherein said conductive element is a gate electrode comprising polysilicon.

10. The structure of claim 8 further comprising a second impurity region formed substantially within said substrate and wherein said first and second impurity regions define a channel region therebetween and further wherein said channel region is oriented along a <100>direction of said substrate.

11. The structure of claim 8 wherein said substrate has a (110) crystalline orientation.

12. A structure comprising:
a substrate having a crystalline orientation;
a source region and a drain region formed in the substrate, at least one of said source region and said drain region including an extension region;
said source region and drain region defining therebetween a channel region, the channel region being oriented in a predetermined direction of said crystalline orientation;
a gate dielectric on a surface of said substrate;
a gate electrode on said gate dielectric, the gate electrode including a silicide comprising an at least partially granular material, the granular material having grains, the grains being substantially aligned, the substantially aligned grains having a major dimension substantially oriented in a first direction and having a minor dimension substantially oriented in a second direction orthogonal to the first direction, the first direction and the second direction being parallel to a surface of the silicide, the major dimension being larger than the minor dimension, the granular material having a plurality of grains along the first direction and the second direction; and
wherein said first direction is selected from the group consisting of parallel to said predetermined direction of said crystalline orientation, and orthogonal to said predetermined direction of said crystalline orientation.

13. The structure of claim 12 wherein said structure is a FET.

14. The structure of claim 13 wherein said FET is a NMOS device and said predetermined direction of said crystalline orientation is <110>.

15. The structure of claim 14 wherein said major dimension is parallel to said predetermined direction of said crystalline orientation.

16. The structure of claim 12 wherein said granular material is the silicide.

17. The structure of claim 16 wherein said silicide is selected from the group consisting essentially of cobalt silicide, erbium silicide, nickel silicide, platinum silicide, tantalum silicide, titanium silicide, and tungsten silicide.

18. The structure of claim 12 wherein said substrate is a semiconductor layer of a silicon-on-insulator (SOI) substrate.

19. The structure of claim 12 further comprising a spacer formed on a sidewall of said gate electrode.

* * * * *